(12) United States Patent
Huang et al.

(10) Patent No.: US 9,425,150 B2
(45) Date of Patent: Aug. 23, 2016

(54) MULTI-VIA INTERCONNECT STRUCTURE AND METHOD OF MANUFACTURE

(71) Applicant: Taiwan Semiconductor Manufacturing Company, Ltd., Hsin-Chu (TW)

(72) Inventors: Yu-Fei Huang, Pleasanton, CA (US); Ming Xiang Li, San Jose, CA (US); Edward Wan, Fremont, CA (US); Jacob Chen, Los Altos, CA (US); Dun-Nian Yaung, Hsin-Chu (TW); Cheng-Eng Daniel Chen, Richardson, TX (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/257,759

(22) Filed: Apr. 21, 2014

(65) Prior Publication Data

US 2015/0228584 A1   Aug. 13, 2015

Related U.S. Application Data

(60) Provisional application No. 61/939,577, filed on Feb. 13, 2014.

(51) Int. Cl.
*H01L 23/538* (2006.01)
*H01L 21/768* (2006.01)
(Continued)

(52) U.S. Cl.
CPC ...... *H01L 23/5384* (2013.01); *H01L 21/76877* (2013.01); *H01L 21/76895* (2013.01); *H01L 21/76898* (2013.01); *H01L 23/5386* (2013.01);
(Continued)

(58) Field of Classification Search
CPC ............. H01L 23/5384; H01L 21/76898; H01L 25/0657; H01L 23/5386; H01L 25/50; H01L 21/76895; H01L 21/76877; H01L 2225/06524; H01L 2225/06548
USPC .......................................... 257/774, E21.575
See application file for complete search history.

(56) References Cited

U.S. PATENT DOCUMENTS 4,956,312 A   9/1990   Van Laarhoven
6,111,319 A   8/2000   Liou et al.
(Continued)

FOREIGN PATENT DOCUMENTS

JP    2010114165 A    5/2010
JP    2013251511 A    12/2013
KR    20100094905 A   8/2010

*Primary Examiner* — Julio J Maldonado
*Assistant Examiner* — Farun Lu
(74) *Attorney, Agent, or Firm* — Slater Matsil, LLP

(57) ABSTRACT

An interconnect structure and a method of forming the interconnect structure are provided. Two wafers (and/or dies) are bonded together. A multi-via interconnect structure is formed extending from a backside of a first substrate to interconnect structures in the metallization layers on the first integrated circuit and the second integrated circuit. The multi-via interconnect structure may be formed by thinning a first substrate of a first wafer and forming a first opening through the first substrate. A second opening extends from the first opening to a first interconnect structure on the first wafer, and a third opening extends from the first interconnect structure on the first wafer to a second interconnect structure on the second wafer. The first, second, and third openings are filled with a conductive material, thereby forming a multi-via interconnect structure.

20 Claims, 11 Drawing Sheets

(51) Int. Cl.
*H01L 25/065* (2006.01)
*H01L 25/00* (2006.01)

(52) U.S. Cl.
CPC .......... *H01L 25/0657* (2013.01); *H01L 25/50* (2013.01); *H01L 2225/06524* (2013.01); *H01L 2225/06548* (2013.01); *H01L 2924/0002* (2013.01)

(56) References Cited

U.S. PATENT DOCUMENTS

| | | | |
|---|---|---|---|
| 6,207,494 | B1 | 3/2001 | Graimann et al. |
| 7,453,150 | B1 | 11/2008 | McDonald |
| 7,642,173 | B2 | 1/2010 | McDonald |
| 8,125,052 | B2 | 2/2012 | Jeng et al. |
| 8,153,521 | B2 * | 4/2012 | Kang ................ H01L 21/76898 257/621 |
| 8,158,515 | B2 | 4/2012 | Farooq et al. |
| 8,344,514 | B2 | 1/2013 | Cobbley et al. |
| 8,358,008 | B2 | 1/2013 | Wada et al. |
| 8,421,193 | B2 | 4/2013 | Huang |
| 8,525,345 | B2 | 9/2013 | Yen et al. |
| 8,592,991 | B2 | 11/2013 | Lee et al. |
| 8,692,382 | B2 | 4/2014 | Yen et al. |
| 9,006,804 | B2 | 4/2015 | Hung et al. |
| 9,059,696 | B1 * | 6/2015 | Rahman ............ H03K 19/0013 |
| 2002/0123219 | A1 | 9/2002 | Laverty et al. |
| 2006/0073695 | A1 | 4/2006 | Filippi et al. |
| 2009/0014843 | A1 | 1/2009 | Kawashita et al. |
| 2009/0134432 | A1 | 5/2009 | Tabata et al. |
| 2010/0090317 | A1 | 4/2010 | Zimmermann et al. |
| 2010/0171196 | A1 | 7/2010 | Steadman et al. |
| 2010/0224876 | A1 | 9/2010 | Zhu |
| 2010/0238331 | A1 | 9/2010 | Umebayashi et al. |
| 2011/0062501 | A1 | 3/2011 | Soss et al. |
| 2011/0133339 | A1 | 6/2011 | Wang |
| 2011/0171582 | A1 | 7/2011 | Farooq et al. |
| 2011/0171827 | A1 | 7/2011 | Farooq et al. |
| 2012/0038020 | A1 | 2/2012 | Lin et al. |
| 2012/0038028 | A1 | 2/2012 | Yaung et al. |
| 2012/0056330 | A1 | 3/2012 | Lee et al. |
| 2012/0181698 | A1 | 7/2012 | Xie et al. |
| 2012/0193785 | A1 | 8/2012 | Lin et al. |
| 2013/0093098 | A1 | 4/2013 | Yang et al. |
| 2013/0264688 | A1 * | 10/2013 | Qian ................ H01L 21/76898 257/622 |
| 2014/0070426 | A1 | 3/2014 | Park et al. |
| 2014/0175653 | A1 | 6/2014 | Sandhu et al. |
| 2014/0247380 | A1 | 9/2014 | Hynecek |
| 2014/0264709 | A1 | 9/2014 | Tsai et al. |
| 2014/0264862 | A1 | 9/2014 | Tsai et al. |
| 2014/0264947 | A1 | 9/2014 | Lin et al. |
| 2014/0361352 | A1 | 12/2014 | Hung et al. |
| 2015/0129942 | A1 | 5/2015 | Kao |
| 2015/0221695 | A1 | 8/2015 | Park et al. |

* cited by examiner

MULTI-VIA INTERCONNECT STRUCTURE AND METHOD OF MANUFACTURE

This application claims the benefit of U.S. Provisional Application No. 61/939,577 filed on Feb. 13, 2014, entitled "MULTI-VIA INTERCONNECT STRUCTURE AND METHOD OF MANUFACTURE," which applications are hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
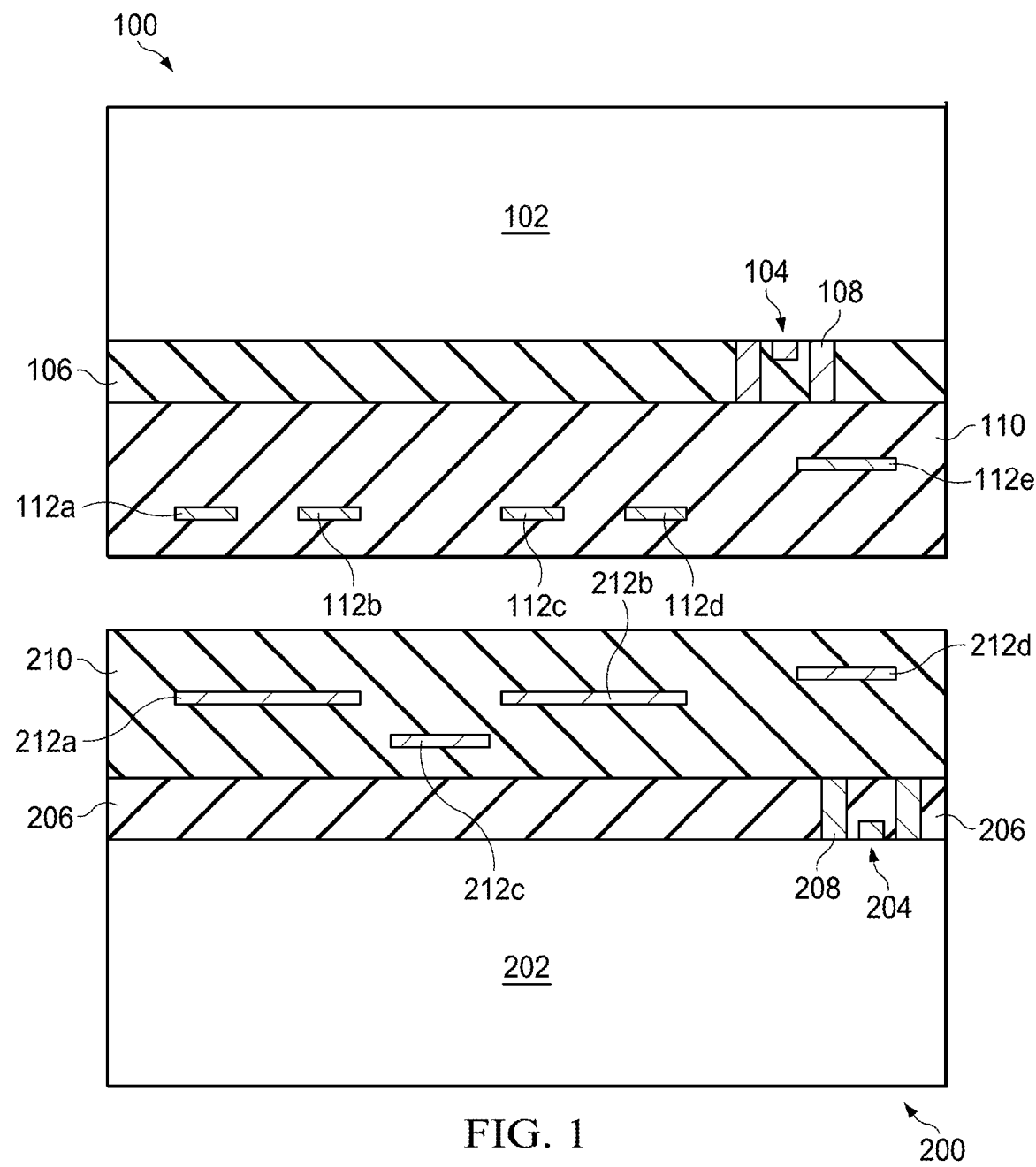
FIGS. 1-7 illustrate various intermediate stages of forming a semiconductor device having a multi-via interconnect structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As discussed in greater detail below, embodiments such as those discussed herein provide a multi-via interconnect structure that may allow contacts having a extremely small pitch size, such as less than or equal to 10 μm, less than or equal to 5 μm, less than or equal to 1 μm, or the like. Such a small pitch size allows designers to achieve lower costs, lower power, and higher density configurations. Embodiments such as these may be particularly useful to integrate dies of various technology nodes and/or various functional dies, thereby providing a more cost effective alternative to designing costly monolithic integrated devices. In contrast, existing approaches with a pitch greater than 40 μm pitch, or even greater than about 10 μm pitch, will not only increase die size and the form factor of the system, it will also increase circuit parasitic components value, (such as resistance, capacitance and inductance) which will sacrifice product performance, or even product reliability (due to, for example, voltage overshoot from high inductance).

For example, some embodiments may integrate a 10 nm node/16 nm node FinFET integrated circuit die and a 28 nm integrated circuit die into a single package, thus allowing for greater flexibilities in integrating various technologies into a single package. This may allow, for example, a processor die of one technology node to be interconnected with a memory of another technology node. As another example, some embodiments may integrate different dies having different functionalities such as image sensors, analog devices, memory, sensors, large passive devices, and the like into a single package. For example, the upper die and the lower die may form a memory stack, and in another example, one die may be an image sensor and the other die may be a logic die or an ASIC die.

FIGS. 1-7 illustrate various intermediate steps of forming an interconnect structure between two bonded wafers or dies in accordance with some embodiments. Referring first to FIG. 1, a first wafer 100 and a second wafer 200 are shown prior to a bonding process in accordance with various embodiments. In some embodiments, the second wafer 200 has similar features as the first wafer 100, and for the purpose of the following discussion, the features of the second wafer 200 having reference numerals of the form "2xx" are similar to features of the first wafer 100 having reference numerals of the form "1xx," the "xx" being the same numerals for the first substrate 102 and the second substrate 202. The various elements of the first wafer 100 and the second wafer 200 will be referred to as the "first <element> 1xx" and the "second <element> 2xx," respectively.

In some embodiments, the first wafer 100 comprises a first substrate 102 having a first electrical circuit (illustrated collectively by first electrical circuitry 104) formed thereon. The first substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The first electrical circuitry 104 formed on the first substrate 102 may be any type of circuitry suitable for a particular application. In some embodiments, the circuitry includes electrical devices formed on the substrate with one or more dielectric layers overlying the electrical devices. Metal layers may be formed between dielectric layers to route electrical signals between the electrical devices. Electrical devices may also be formed in one or more dielectric layers.

For example, the first electrical circuitry 104 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Also shown in FIG. 1 is a first inter-layer dielectric (ILD)/inter-metallization dielectric (IMD) layer 106. The first ILD layer 106 may be formed, for example, of a low-K dielectric material, such as phosphosilicate glass (PSG), borophosphosilicate glass (BPSG), FSG, SiOxCy, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the first ILD layer 106 may comprise a plurality of dielectric layers.

First contacts 108 are formed through the first ILD layer 106 to provide an electrical contact to the first electrical circuitry 104. The first contacts 108 may be formed, for example, by using photolithography techniques to deposit and pattern a photoresist material on the first ILD layer 106 to expose portions of the first ILD layer 106 that are to become the first contacts 108. An etch process, such as an anisotropic dry etch process, may be used to create openings in the first ILD layer 106. The openings may be lined with a diffusion barrier layer and/or an adhesion layer (not shown), and filled with a conductive material. The diffusion barrier layer may comprise one or more layers of TaN, Ta, TiN, Ti, CoW, or the like, and the conductive material comprises copper, tungsten, aluminum, silver, and combinations thereof, or the like, thereby forming the first contacts 108 as illustrated in FIG. 1.

One or more additional ILD layers 110 and the first interconnect lines 112a-112e (collectively referred to as first interconnect lines 112) form metallization layers over the first ILD layer 106. Generally, the one or more additional ILD layers 110 and the associated metallization layers are used to interconnect the electrical circuitry to each other and to provide an external electrical connection. The additional ILD layers 110 may be formed of a low-K dielectric material, such as fluorosilicate glass (FSG) formed by PECVD techniques or high-density plasma chemical vapor deposition (HDPCVD) or the like, and may include intermediate etch stop layers. External contacts (not shown) may be formed in an uppermost layer.

It should also be noted that one or more etch stop layers (not shown) may be positioned between adjacent ones of the ILD layers, e.g., the first ILD layer 106 and the additional ILD layers 110. Generally, the etch stop layers provide a mechanism to stop an etching process when forming vias and/or contacts. The etch stop layers are formed of a dielectric material having a different etch selectivity from adjacent layers, e.g., the underlying first substrate 102 and the overlying ILD layers 106/110. In an embodiment, etch stop layers may be formed of SiN, SiCN, SiCO, CN, combinations thereof, or the like, deposited by CVD or PECVD techniques.

In some embodiments, the first wafer 100 and the second wafer 200 may provide different or the same functionality. For example, the first wafer 100 and the second wafer 200 may form a memory stack, and in another example, one die may be an image sensor and the other die may be a logic die or an ASIC die. In one such example, the first wafer 100 is a backside illumination sensor (BIS) and the second wafer 200 is a logic circuit, such as an ASIC device. In this embodiment, the first electrical circuit 104 includes photo active regions, such as photo-diodes formed by implanting impurity ions into the epitaxial layer. Furthermore, the photo active regions may be a PN junction photo-diode, a PNP photo-transistor, an NPN photo-transistor or the like. The BIS sensor may be formed in an epitaxial layer over a silicon substrate. The second wafer 200 may comprise a logic circuit, an analog-to-digital converter, a data processing circuit, a memory circuit, a bias circuit, a reference circuit, and the like.

As another example, the upper and lower dies may be of the same or a different technology node, such as 10 nm, 16 nm, 28 nm, and the like. This may allow, for example, a processor die of one technology node to be interconnected with a memory of another technology node.

In an embodiment, the first wafer 100 and the second wafer 200 are arranged with the device sides of the first substrate 102 and the second substrate 202 facing each other as illustrated in FIG. 1. As discussed in greater detail below, an opening will be formed extending from a backside (opposite the device side) of the first wafer 100 to the selected portions of the second interconnect lines 212 of the second wafer 200, such that portions of selected first interconnect lines 112 of the first wafer 100 will also be exposed. The opening will be subsequently filled with a conductive material, thereby forming an electrical contact on the backside of the first wafer to the interconnect lines of the first wafer 100 and the second wafer 200.

Figure 2:
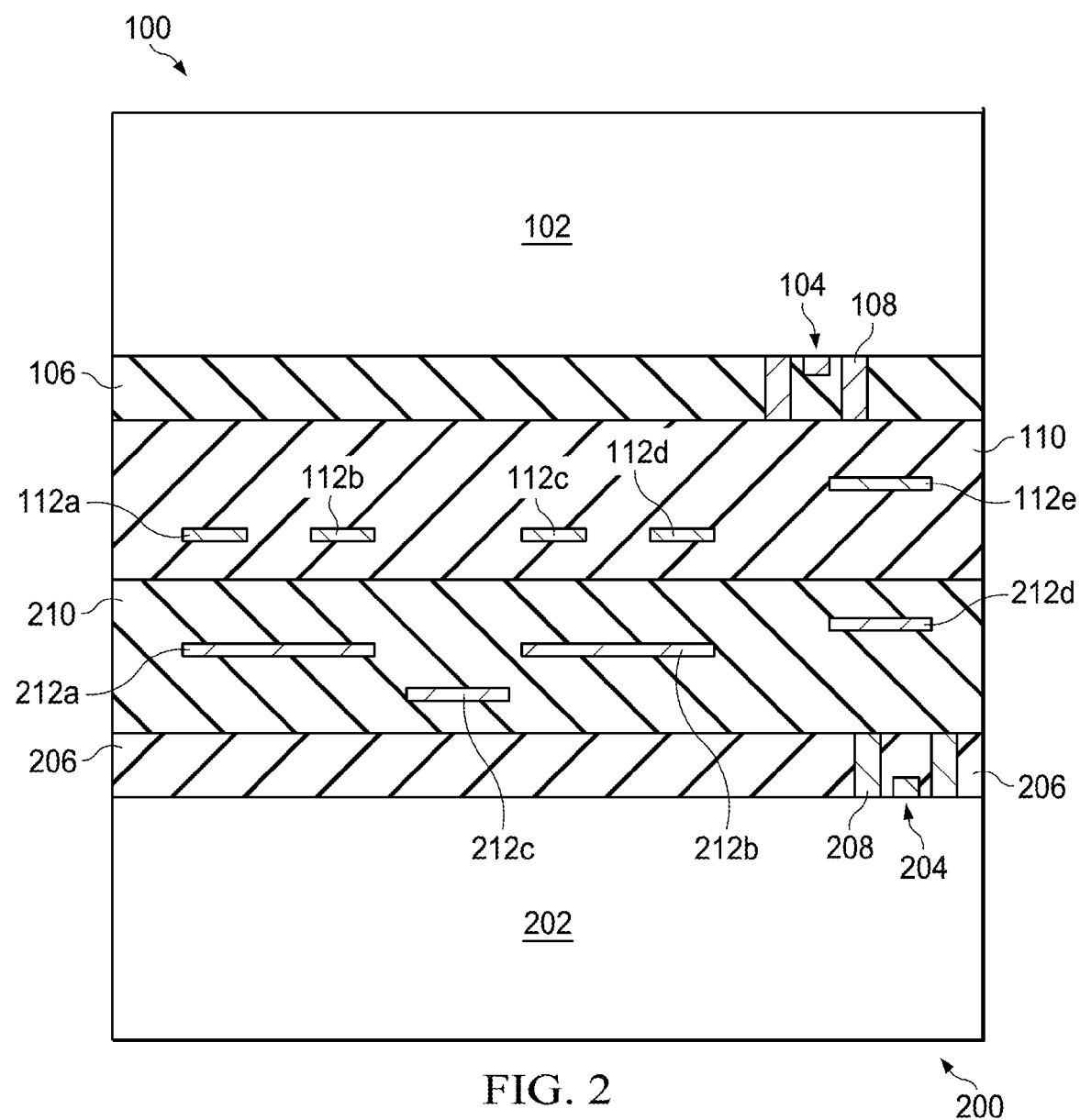

FIG. 2 illustrates the first wafer 100 and the second wafer 200 after bonding in accordance with an embodiment. As shown in FIG. 1, the first wafer 100 will be stacked and bonded on top of the second wafer 200. The first wafer 100 and the second wafer 200 may be bonded by any suitable method, such as direct bonding, fusion bonding, chemically activated bonding, plasma activated bonding, anodic bonding, eutectic bonding, glass frit bonding, adhesive bonding, thermo-compressive bonding, reactive bonding and/or the like, and may include as dielectric-to-dielectric bonding (e.g., oxide-to-oxide bonding), metal-to-metal bonding (e.g., copper-to-copper bonding), hybrid bonding or the like. In some embodiments, a bonding surface of the first wafer 100 and the second wafer 200 may be coated with one or more bonding layers, such as a pad oxide and/or a high-density plasma (HDP) oxide, to provide a high-quality bonding surface.

It should be noted that the bonding may be at wafer level, wherein the first wafer 100 and the second wafer 200 are bonded together and subsequently singulated into separated dies. Alternatively, the bonding may be performed at the die-to-die level, or the die-to-wafer level.

As shown in FIG. 2, a pattern of select ones of the first interconnect lines 112 are aligned with select ones of the second interconnect lines 212. For example, a pattern of the first interconnect lines 112a and 112b of the first wafer 100 are aligned with a pattern of the second interconnect line 212a of the second wafer 200, and a pattern of the first interconnect lines 112c and 112d of the first wafer 100 are aligned with a pattern of the second interconnect line 212b. As will be discussed below, a first multi-via structure will be formed to provide an electrical contact to the first interconnect lines 112a and 112b of the first wafer 100 and the second interconnect line 212a of the second wafer 200, and a second multi-via structure will be formed to provide an electrical contact to the first interconnect lines 112c and 112d of the first wafer 100 and the second interconnect line 212b of the second wafer 200, with the first multi-via structure extending between the gap of the first interconnect lines 112a and 112b, and with the second multi-via structure extending between the gap of the first interconnect lines 112c and 112d. In some embodiments, the first interconnect lines 112a and 112b, and similarly with the first interconnect lines 112c and 112d, represent portions of a single interconnect structure, such as a pad having an opening formed therein. In other embodiments the first interconnect structures 112a and 112b, and similarly the first interconnect lines 112c and 112d, may represent two or more conductive lines.

Figure 3:
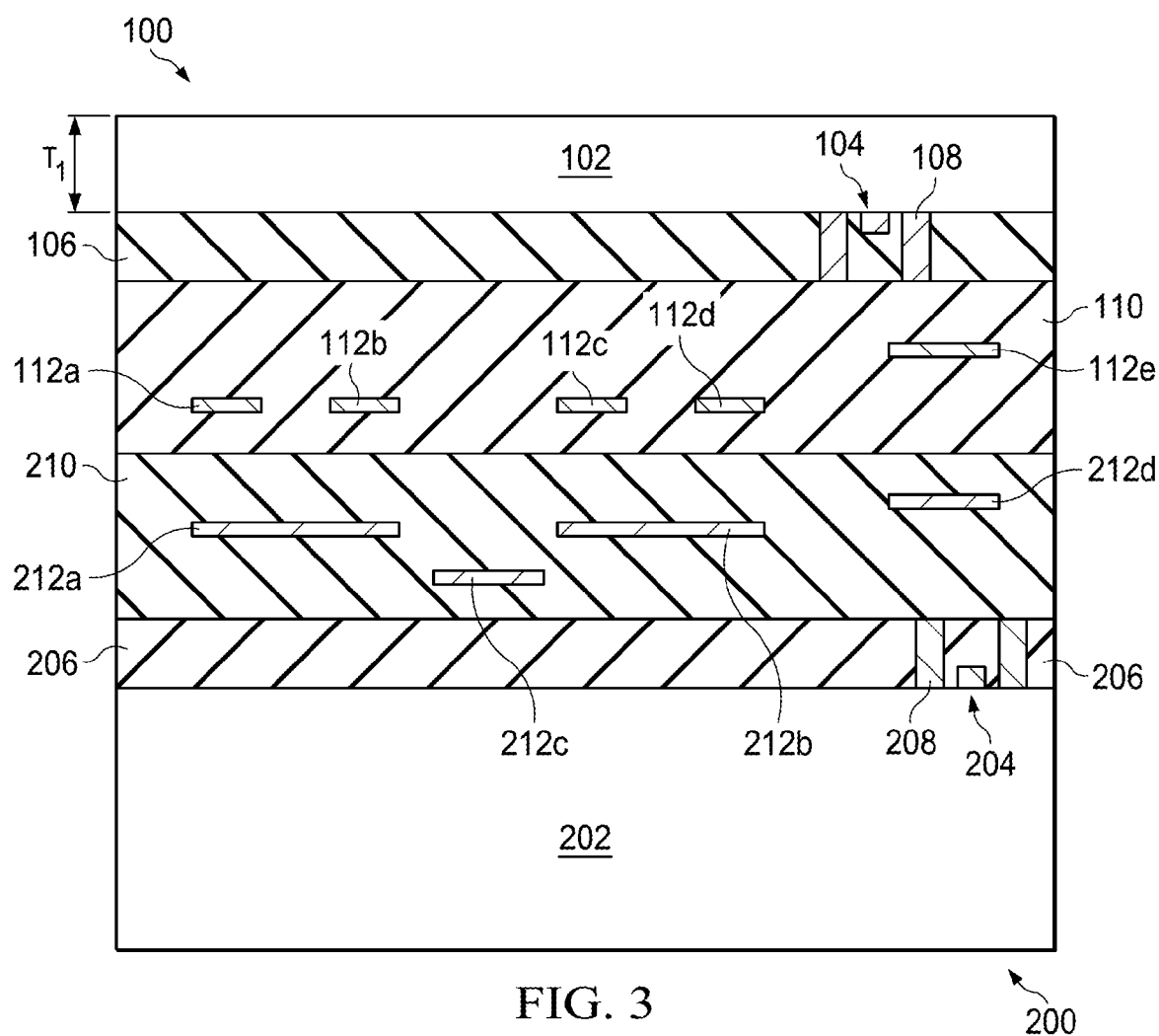

FIG. 3 illustrates a result of a thinning process in accordance with some embodiments. After the first wafer 100 and the second wafer 200 are bonded, a thinning process may be applied to the backside of the first wafer 100. In an embodiment in which the first substrate 102 is a BIS sensor, the thinning process serves to allow more light to pass through from the backside of the first substrate to the photo-active regions without being absorbed by the substrate. In an embodiment in which the BIS sensor is fabricated in an epitaxial layer, the backside of the first wafer 100 may be thinned until the epitaxial layer is exposed. The thinning process may be implemented by using suitable techniques such as grinding, polishing, a SMARTCUT® procedure, an ELTRAN® procedure, and/or chemical etching. Another suitable process is described in U.S. Pat. No. 8,048,807, which is incorporated herein by reference. In some embodiments, the substrate of the first wafer 100 is thinned to a thickness $T_1$, such as less than or equal to about 5 µm, such as less than or equal to about 3 µm. Thinning the first wafer 100 to a thickness such as this allows formation of a shallow via through the first substrate 102, which in turns allows for a much smaller pitch between adjacent multi-via interconnections. The thinning further reduces wafer-to-wafer alignment DoF (depth of focus) which enables much better alignment resolution of via to metal pads. A passivation layer or dielectric layer may be formed along a backside of the thinned substrate to protect the substrate, e.g., the silicon substrate, from the environment.

Figure 4:
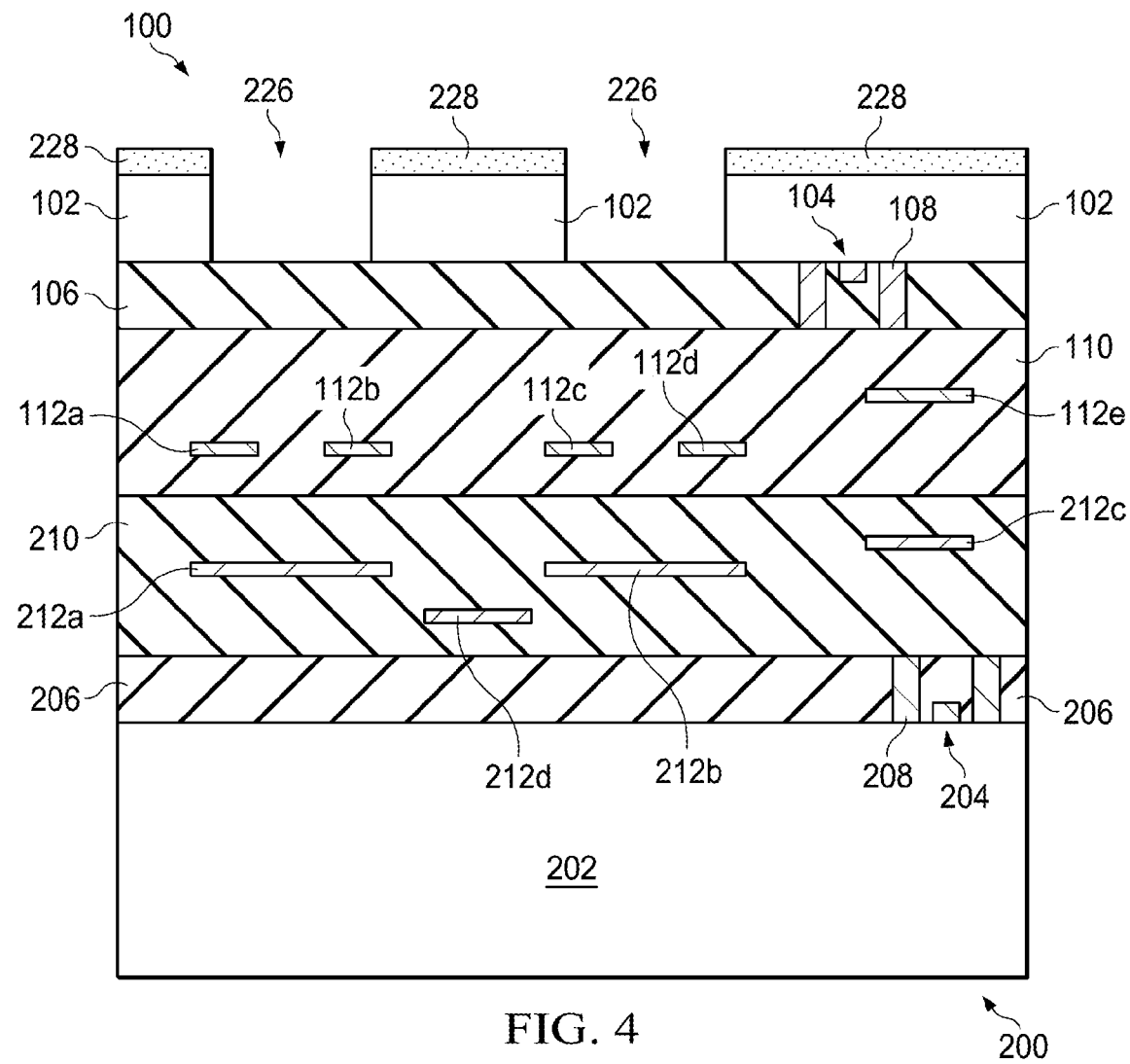

Referring now to FIG. 4, first openings 226 are formed in the first substrate 102. As discussed in greater detail below, an electrical connection will be formed extending from a backside of the first wafer 100 to select ones of the second interconnect lines 212 of the second wafer 200. The first openings 226 represent the opening in which the backside contact will be formed. The first openings 226 may be formed using photolithography techniques. Generally, photolithography techniques involve depositing a photoresist material, which is subsequently irradiated (exposed) and developed to remove a portion of the photoresist material. The remaining photoresist material protects the underlying material from subsequent processing steps, such as etching.

Also shown in FIG. 4 is one or more protective coatings 228 (represented in FIG. 4 as a single layer for illustrative purposes). The protective coatings 228 may be one or more layers to protect the backside of the substrate, e.g., the silicon substrate, from the environment, and/or to aid in the patterning process. For example, in some embodiments, the protective coatings 228 may also act as anti-reflection coating (ARC) layer. The ARC layer reduces the reflection of the exposure light used during the photolithography process to pattern a patterned mask (not shown), which reflection may cause inaccuracies in the patterning. The ARC layer may be formed of a nitride material (e.g., silicon nitride), an organic material (e.g., silicon carbide), an oxide material, high-k dielectric, and the like. The ARC layer may be formed using suitable techniques such as CVD and/or the like.

Other layers may be used in the patterning process. For example, one or more optional hard mask layers may be used to pattern the first substrate 102. Generally, one or more hard mask layers may be useful in embodiments in which the etching process requires masking in addition to the masking provided by the photoresist material. During the subsequent etching process to pattern the first substrate 102, the patterned photoresist mask will also be etched, although the etch rate of the photoresist material may not be as high as the etch rate of the first substrate 102. If the etch process is such that the patterned photoresist mask would be consumed before the etching process is completed, then an additional hard mask may be utilized. The material of the hard mask layer or layers is selected such that the hard mask layer(s) exhibit a lower etch rate than the underlying materials, such as the materials of the first substrate 102.

Figure 5:
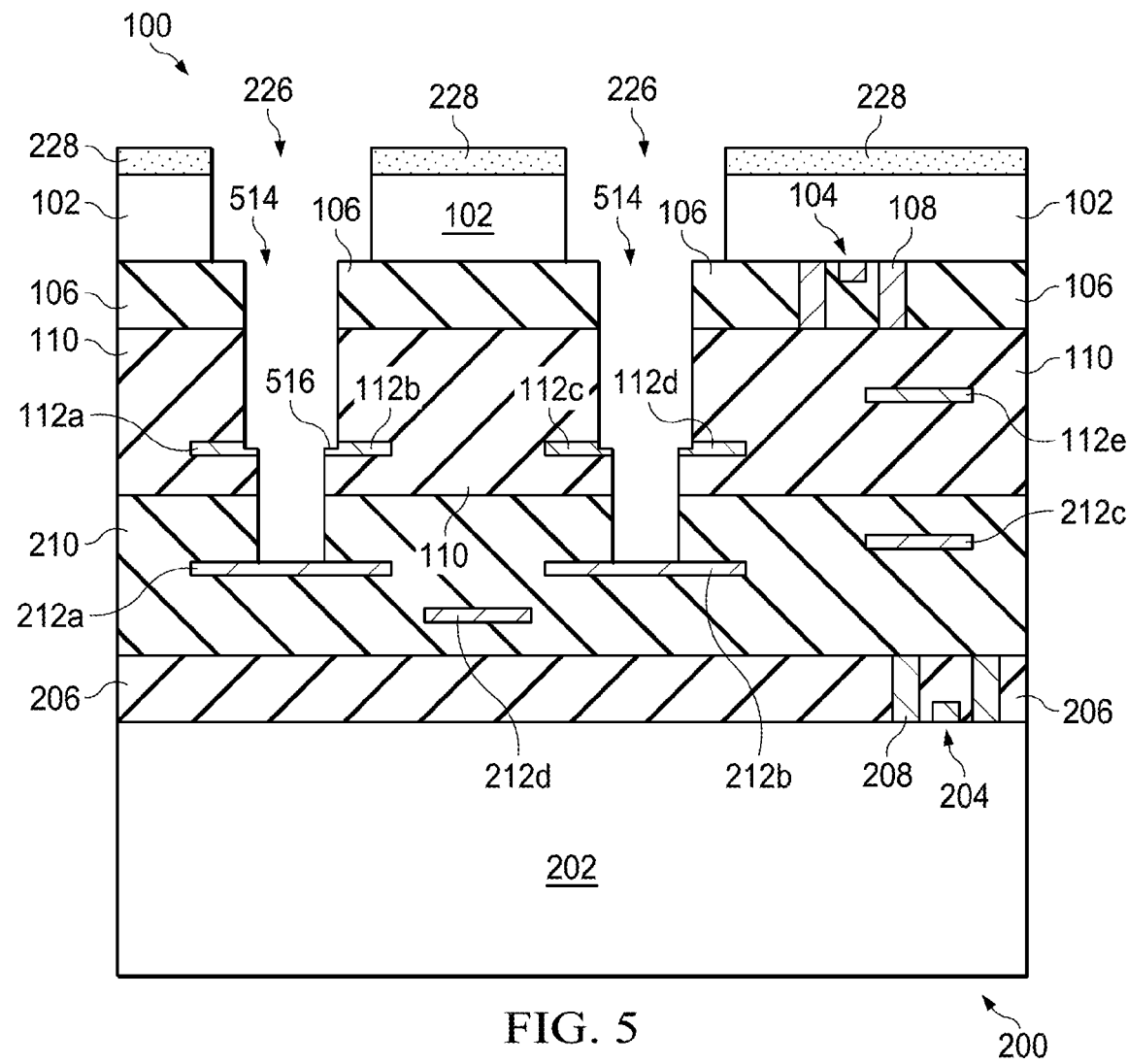

FIG. 5 illustrates the semiconductor device shown in FIG. 4 after one or more additional etching processes are performed in accordance with some embodiments. A suitable etching process, such as a dry etch, an anisotropic wet etch, or any other suitable anisotropic etch or patterning process, may be performed on the semiconductor device to form second openings 514. In some embodiments, a patterned mask (not shown), such as a photoresist, may be formed and patterned to define the second openings 514.

As illustrated in FIG. 5, the second openings 514 extend from the first openings 226 to respective ones of the first interconnect lines 112 and the second interconnect lines 212. In an embodiment, the first interconnect lines 112 are formed of suitable metal materials such as copper, which exhibits a different etching rate (selectivity) than the first ILD layers 110. As such, the first interconnect lines 112 function as a hard mask layer for the etching process of the first ILD layers 110. A selective etching process may be employed to etch the first ILD layers 110 rapidly while etching only a portion of the first interconnect lines 112. As shown in FIG. 5, the exposed portion of the first interconnect lines 112 may be partially etched away, thereby forming a recess 516, as the etch process continues toward the second interconnect lines 212. The depth of the recess 516 may vary depending on a variety of applications and design needs.

The second etch process continues until respective ones of the second interconnect lines 212 are exposed, thereby forming combined openings extending from a backside of the first wafer 100 to the second interconnect lines 212 of the second wafer 200 as illustrated in FIG. 5.

It should be noted that the second etch process may extend through a variety of various layers used to form the first ILD layers 110 and the second ILD layers 210, which may include various types of materials and etch stop layers. Accordingly, the second etch process may utilize multiple etchants to etch through the various layers, wherein the etchants are selected based upon the materials being etched.

Figure 6:
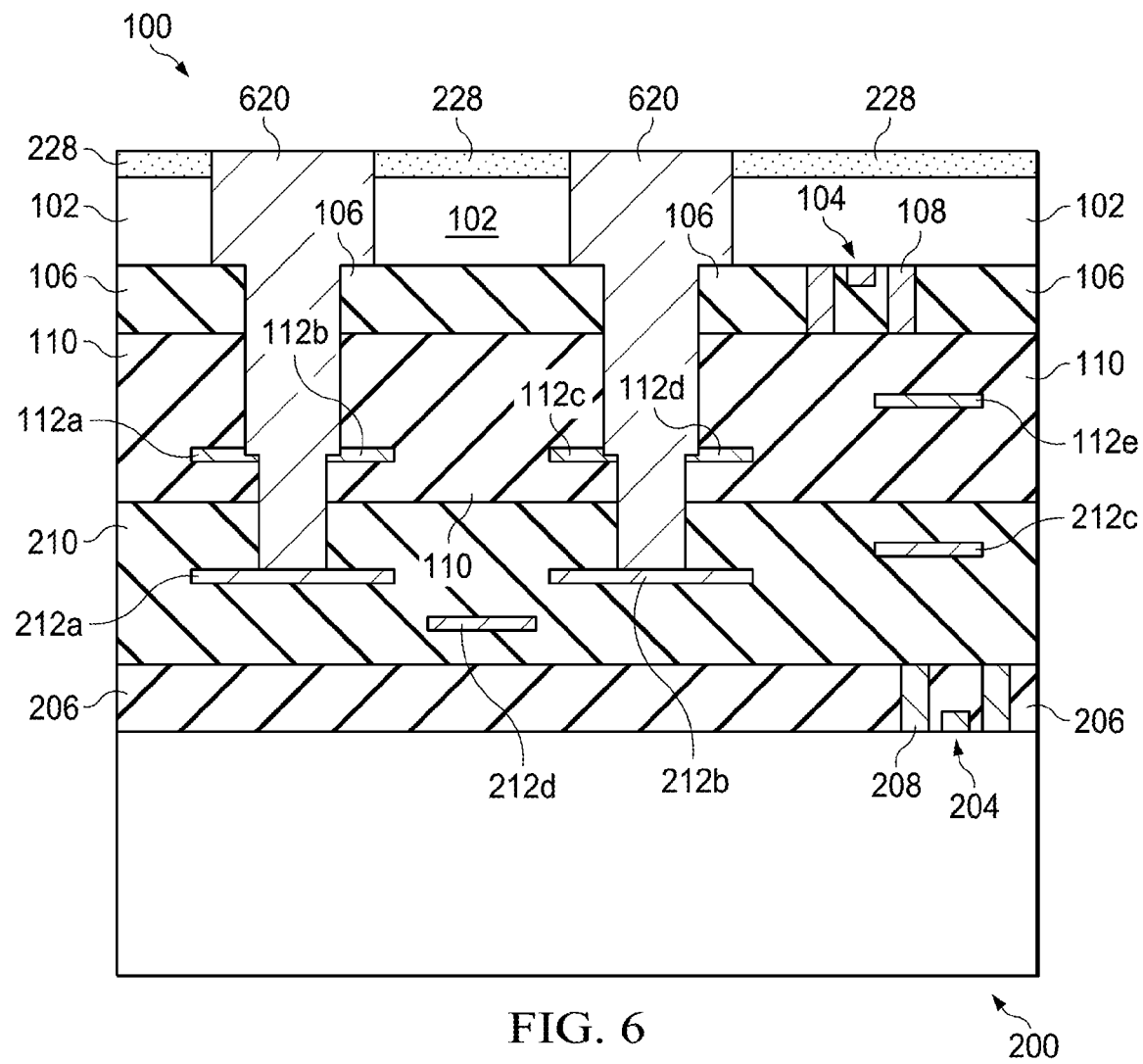

FIG. 6 illustrates a conductive material formed within the first openings 226 and the second openings 514 (see FIG. 5), thereby forming multi-via interconnect structures 620 in accordance with some embodiments. In some embodiments, the conductive material may be formed by depositing one or more diffusion and/or barrier layers and depositing a seed layer. For example, a diffusion barrier layer comprising one or more layers of Ta, TaN, TiN, Ti, CoW, or the like is formed along the sidewalls of the first openings 226 and the second openings 514. The seed layer (not shown) may be formed of copper, nickel, gold, any combination thereof and/or the like. The diffusion barrier layer and the seed layer may be formed by suitable deposition techniques such as PVD, CVD and/or the like. Once the seed layer has been deposited in the openings, a conductive material, such as tungsten, titanium, aluminum, copper, any combinations thereof and/or the like, is filled into the first openings 310 and the second openings 514, using, for example, an electro-chemical plating process, thereby forming multi-via interconnect structures 620.

FIG. 6 also illustrates removal of excess materials, e.g., excess conductive materials, from the backside of the first substrate 102. In some embodiments, the excess materials may be removed using an etch process, a planarization process (e.g., a CMP process), or the like.

Figure 7:
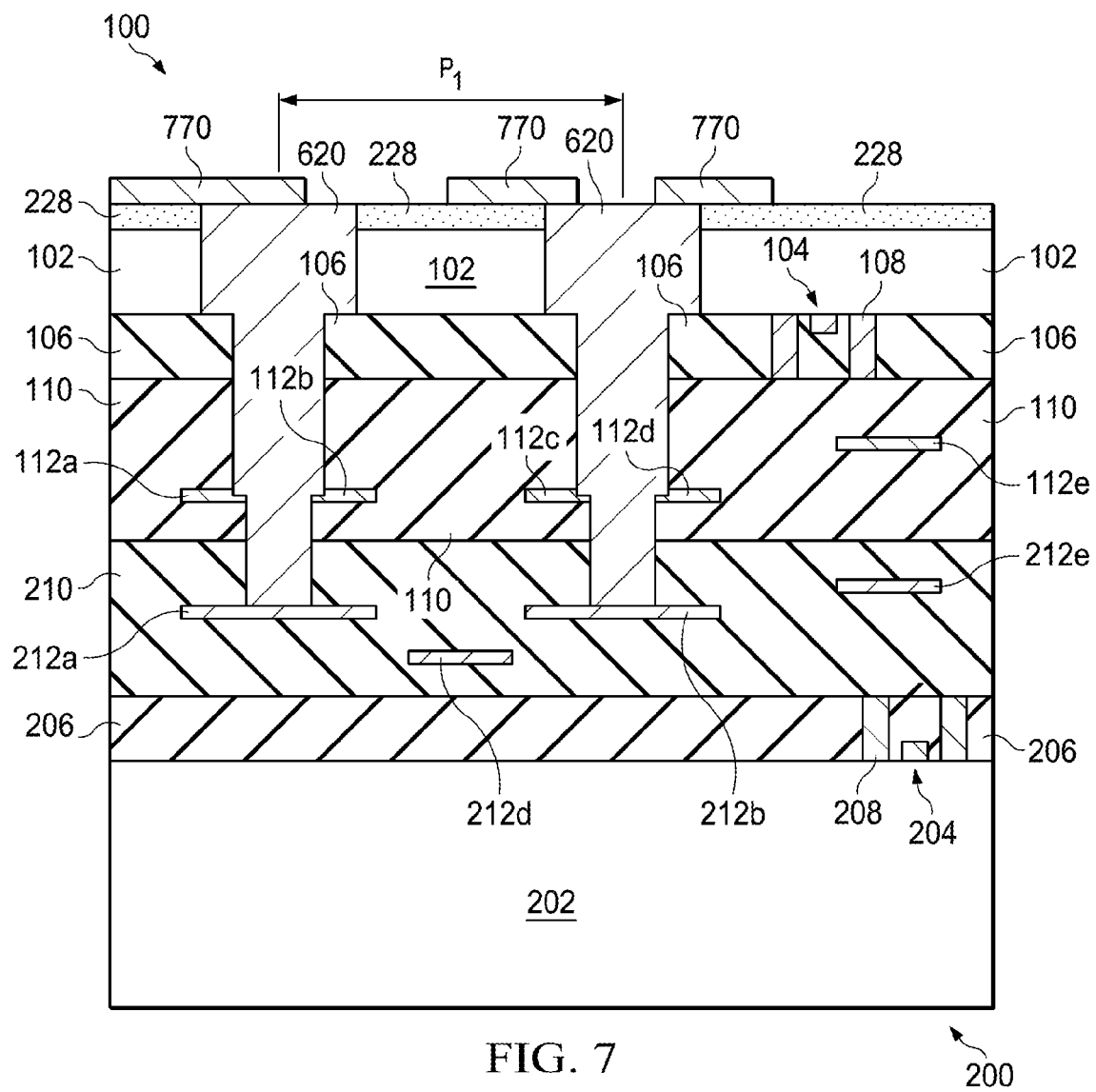

Thereafter, one or more additional processing steps may be performed. For example, capping layers, redistribution lines, contact pad structures, and the like may be formed. FIG. 7 illustrates an example in which a redistribution line and/or landing pads (represented by element 770) are formed to provide an electrical connection to the multi-via interconnect structures 620. In some embodiments, the multi-via interconnect structures 620 are filled with a conductive material simultaneously as forming a redistribution layer (RDL). In some embodiments, the RDL is formed before or after forming the multi-via interconnect structures 620.

FIG. 7 illustrates an embodiment having a plurality of multi-via interconnect structures 620. Due to the use of multi-via interconnect structures to form a single interconnection, an extremely small pitch P1 may be obtained. This is in part due to the ability to use a smaller via size with a thinner substrate. In some embodiments, a pitch P1 is less than or equal to about 10 µm. In some embodiments, a pitch P1 is less than or equal to about 5 µm. In some embodiments, a pitch P1 is less than or equal to about 1 µm.

Embodiments such as those discussed above provide a multi-via structure that enables a small pitch and a flexible structure that provides multiple ways of interconnection for high device density. A first via extends through the first substrate 102, such as a silicon substrate, of the first wafer 100 and may provide an electrical connection to an RDL or a contact pad. A second via extends through the dielectric layers (e.g., oxide layers, nitride layers, or the like) of the first wafer 100, such as the inter-layer dielectric (ILD) layers, inter-metal dielectric (IMD) layers, etch stop layers, stress layers, or the like to expose portions of select ones of the first interconnect lines 112. A third via extends from the first interconnect lines 112 on the first wafer 100 to the second interconnect lines 212 in the second wafer 200. In embodiments such as these, the first, second, and third vias provide a multi-via interconnect structure to the circuitry on the lower die.

It should be noted that first interconnect lines 112 and the second interconnect lines 212 used to form the multi-via structure may or may not be connected to electrical circuitry of the first wafer 100 and/or the second wafer 200. For example, in some embodiments, the multi-via interconnect structures 620 may interconnect electrical devices on the upper die and the lower die. In some embodiments, the first interconnect lines 112, such as the first interconnect lines 112a and 112b, on the first wafer 100 may not be electrically connected to electrical circuitry on the first wafer 100 such that the multi-via interconnect structure of multi-via interconnect structures 620 provides an electrical connection to electrical circuitry on the second wafer 200. In these embodiments, the first interconnect lines 112 act as an alignment and mask for forming the multi-via interconnect structures 620.

As another example, the multi-via interconnect structure of multi-via interconnect structures 620 may provide an electrical connection between electrical circuitry of the first wafer 100 and the second wafer 200, and the external connection is a dummy connection that is not connected to an external signal. In these embodiments, multi-via interconnect structures 620 may provide an external contact that is not electrically connected. A passivation or other dielectric layer may be formed over an exposed unused external connection in these situations to protect the materials from the external environment.

As discussed above, the multi-via interconnect structure disclosed herein allows stacking of wafers/dies with different process nodes (10/16 nm FinFET, 28 nm etc.). This in turn can reduce or eliminate pad-size-limited constraints due to large pitch of I/O pads limited by existing technologies (such as chip on wafer on substrate (CoWoS)). This approach can reduce pad area by 4× or more, and reduce die size by 10-50% or more if the die size is pad limited. In some embodiments, the density of the devices on the dies may be increased by a factor of 2-4, or more.

The above description provides a general description of the materials and processes. The multi-via interconnect structures 620 may include other structures and utilize other materials and/or processes. For example, the multi-via interconnect structure may include barrier layers, adhesion layers, multiple conductive layers, and/or the like. Suitable processes, structures, and materials are described in U.S. patent application Ser. Nos. 14/135,103 and 14/135,153, both of which are incorporated herein by reference.

Figure 8:
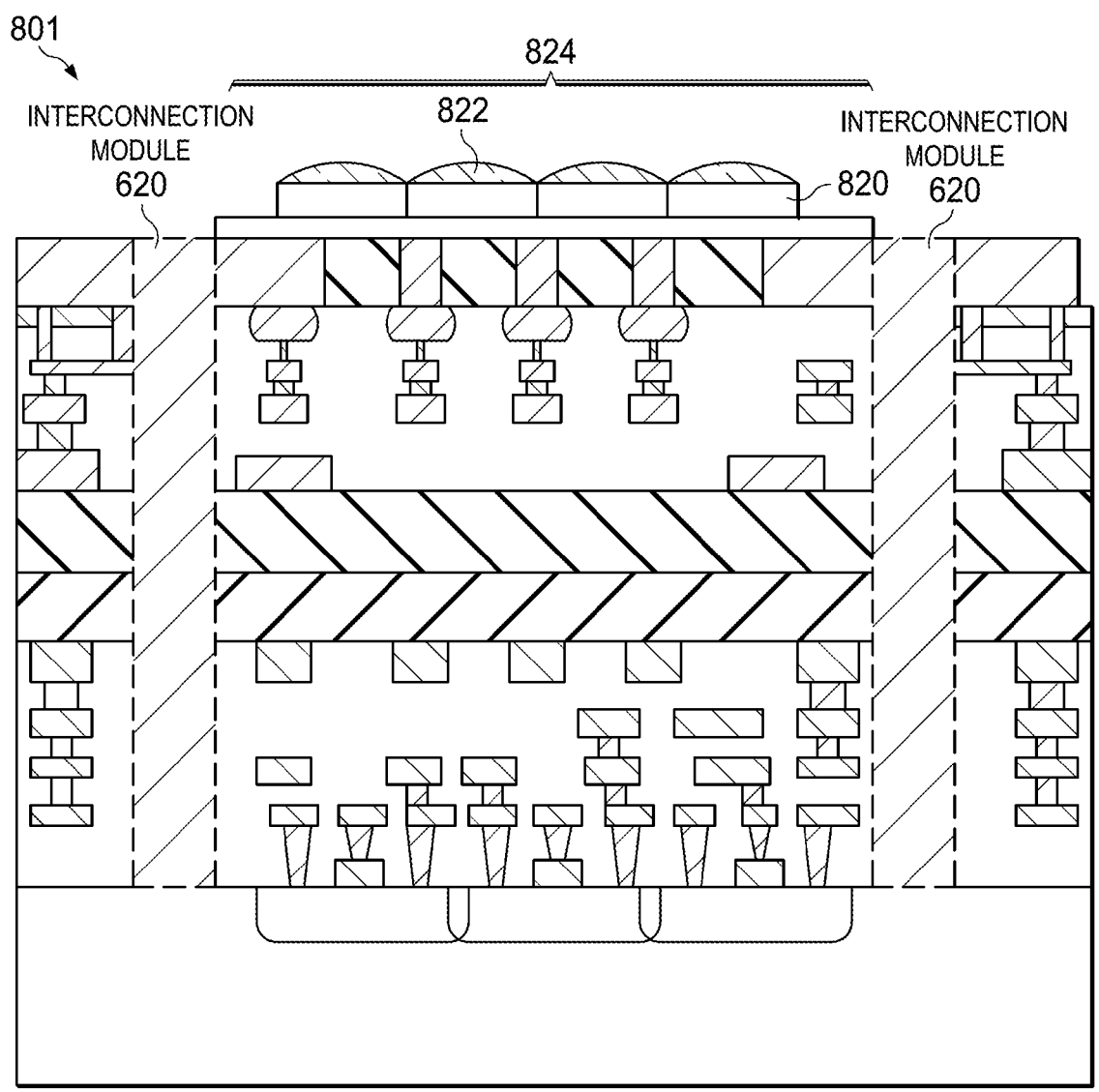
FIG. 8 illustrates multi-via structures in conjunction with an image sensor die and a logic die in accordance with some embodiments.

FIG. 8 illustrates an example of a portion of a 3DIC incorporating an image sensor die and an ASIC die in accordance with some embodiments. In this embodiment, an upper die 801, e.g., the first wafer 100, comprises an image sensor having color filters 820 and microlenses 822 formed on the backside of the upper die. A lower die 802, e.g., the second wafer 200, is an ASIC die providing the logic circuitry for the image sensor. As illustrated in FIG. 8, the multi-via interconnect structure 620 (represented in FIG. 8 by a dotted rectangle) is placed adjacent to a pixel region 824. It should be noted that in some embodiments, the pixel region 824 represents one or more pixels. For example, the multi-via interconnect structure 620 may be interposed between individual pixels, or a group of pixels, or a pixel array. In some embodiments, the multi-via interconnect structure 620 is arranged along a periphery of the pixel array.

Figure 9:
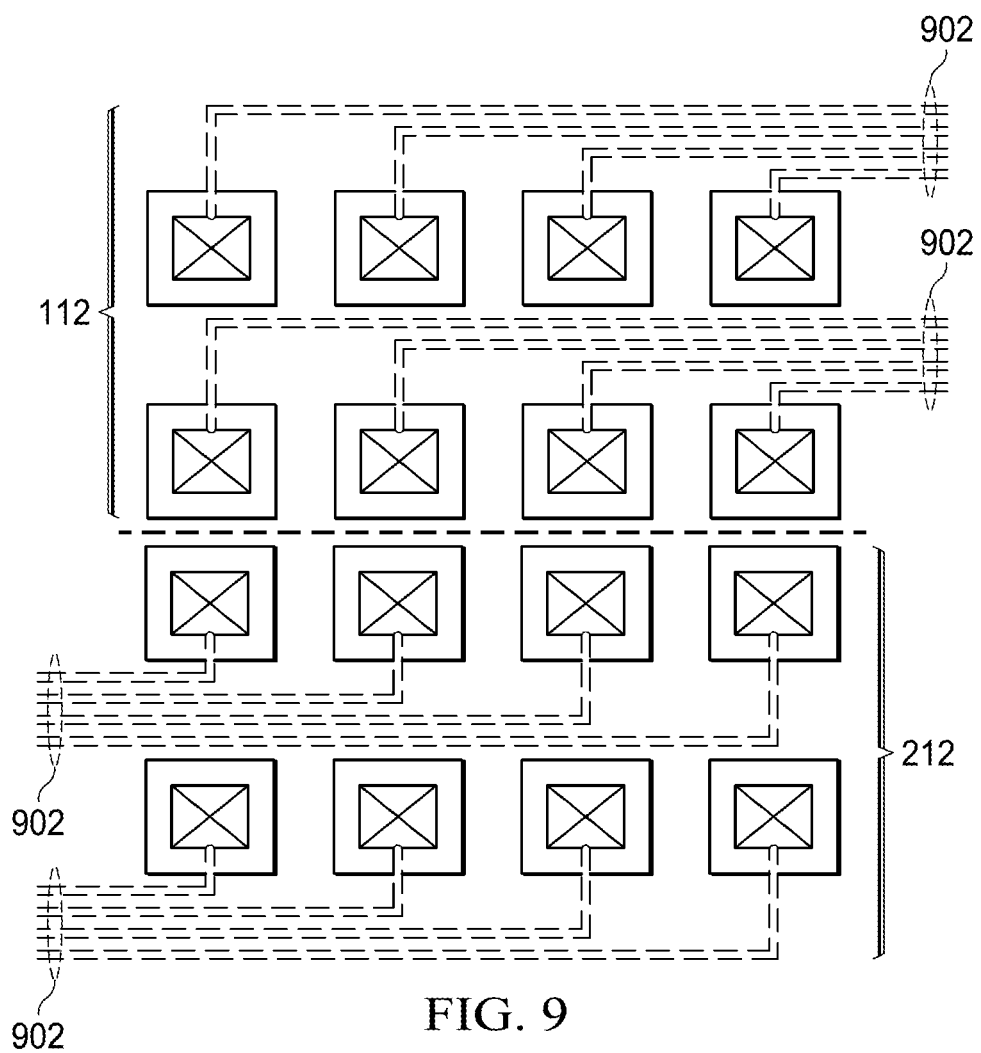
FIG. 9 illustrates a plan view of multi-via interconnect structures in accordance with some embodiments.

FIG. 9 illustrates plan views of a layout of the first interconnect lines 112 and the second interconnect lines 212 in accordance with some embodiments. In FIG. 9, the upper two rows correspond to a pattern of the first interconnect lines 112, and the lower two rows correspond to a pattern of the second interconnect lines 212. When integrated into a system such as that described above, the pattern of the first interconnect lines 112 would overlay the pattern of the second interconnect lines 212. As illustrated in FIG. 9, the patterns can be of a similar size, allowing for a small pitch size. In some embodiments, first interconnect lines 112 and the second interconnect lines 212 may have a size less than or equal to 10 um, less than or equal to about 5 μm, or less than or equal to about 1 μm. It is noted that FIG. 9 does not illustrate the opening in the first interconnect lines 112. FIG. 9 further illustrates conductive traces 902 extending to the first and second interconnect lines 112 and 212.

Figure 10:
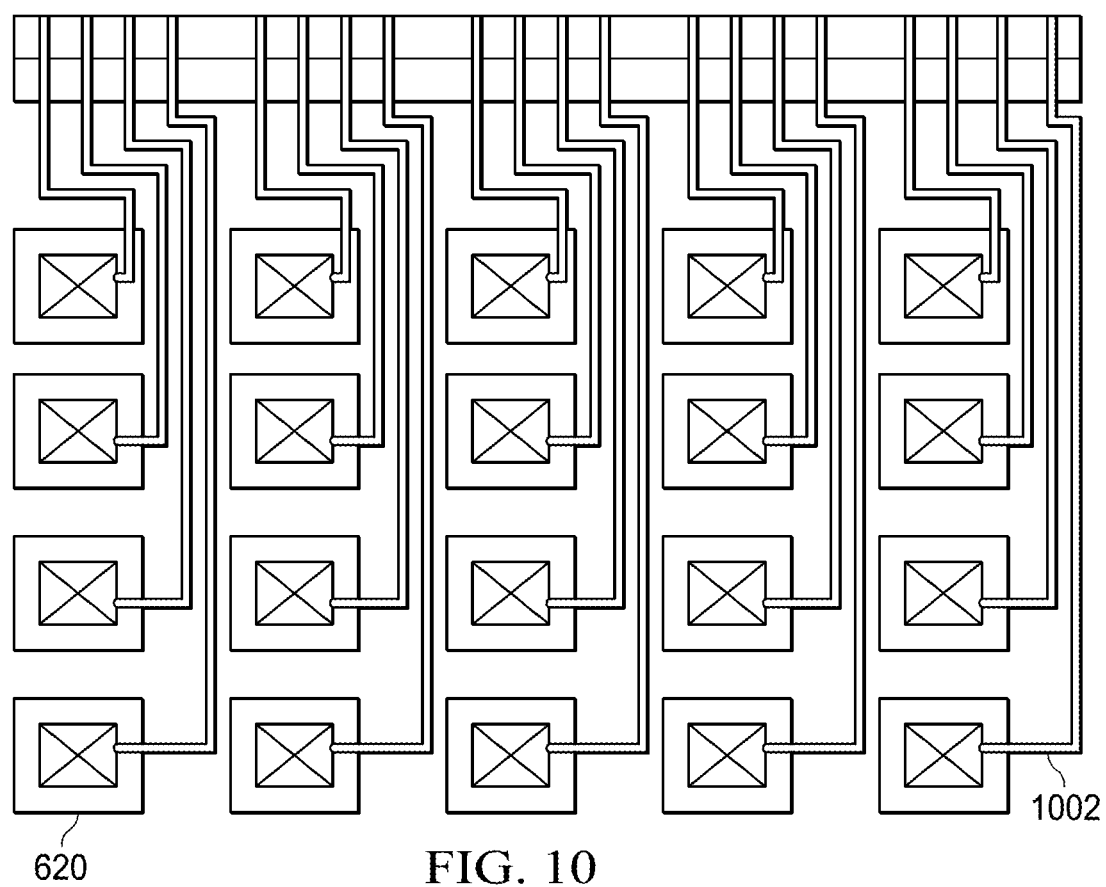
FIG. 10 illustrates a plan view of multi-via interconnect structures in accordance with some embodiments.

FIG. 10 illustrates another pattern of the multi-via interconnect structures 620 in accordance with some embodiments. As illustrated in FIG. 10, the multi-via interconnect structures 620 are arranged in an array pattern. Other patterns and arrangements may be used. FIG. 10 further illustrates conductive traces 1002 connected to the multi-via interconnect structures.

Figure 11:
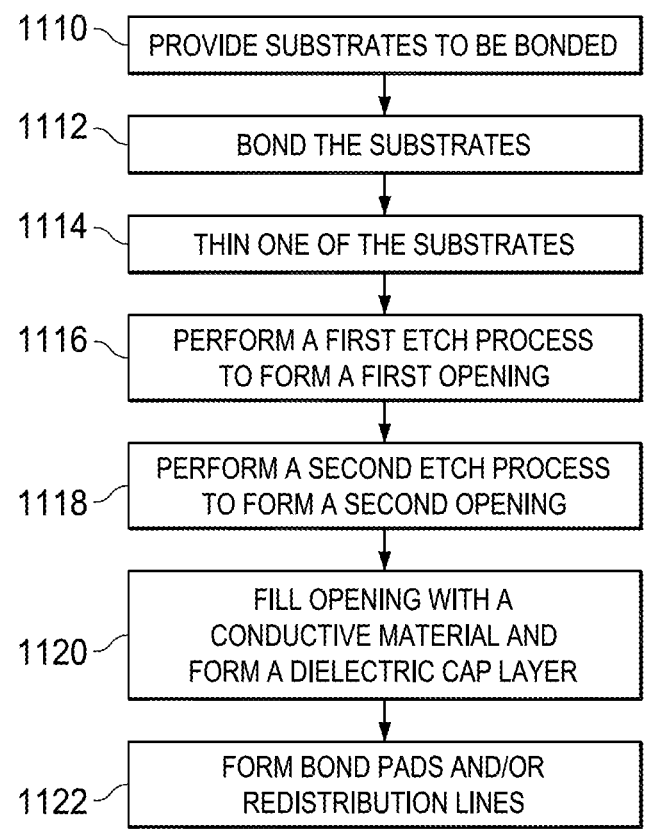
FIG. 11 is a flow diagram illustrating a process of forming a multi-via interconnect structure in accordance with some embodiments.

FIG. 11 is a flowchart illustrating a method of forming a multi-via interconnect structure in a stacked chip configuration in accordance with some embodiments. The method begins in step 1110, wherein substrates to be bonded are provided. The substrates may be processed wafers (such as those illustrated in FIG. 1), dies, a wafer and a die, or the like. In step 1112, the substrates are bonded together, such as discussed above with reference to FIG. 2. In step 1114, one of the bonded substrates is thinned as discussed above with reference to FIG. 3. After the thinning, in step 1116, a first etch process is performed to form a first opening through the thinned substrate, such as discussed above with reference to FIG. 4. Thinning the substrates allows for a smaller pitch between multi-via interconnect structures.

In step 1118, a second etch process is performed to form a second opening extending from within the first opening to select ones of interconnect or line structures formed on the first substrate and/or the second substrate. A patterned mask, as discussed above with reference to FIG. 5, may be used to define the second opening within the first opening. The openings are filled with a conductive material in step 1120, such as that discussed above with reference to FIG. 6, thereby forming a multi-via interconnect structure. Further processing may be performed. For example, in step 1122, bond pads and/or redistribution lines may be formed to provide an external electrical connection to the multi-via interconnect structure as described above with reference to FIG. 7.

The multi-via interconnect structure may be arranged in any suitable manner and pattern. For example, in some embodiments, the multi-via interconnect structure may be arranged along a periphery of the die. In some embodiments, the multi-via interconnect structure may be intermixed with the electrical circuitry or pixels, such as in the electrical circuitry of a logic die or pixels of an image sensor.

It can be appreciated that embodiments such as those disclosed above provide a multi-via interconnect structure that may allow contacts having a small pitch size, such as less than or equal to 10 um, less than or equal to 5 um, less than or equal to 1 um, or the like. Such a small pitch size allows designers to achieve lower costs, lower power, and higher density configurations. Furthermore, the various structures may be utilized to provide different I/O voltages sources and/or values (e.g., 0.8V, 1.8V, or the like) to various components in the stacked chip configuration. Embodiments such as these may be particularly useful to integrate dies of various technology nodes (e.g., 10 nm node, 16 nm node, and the like) and/or various functional dies (e.g., image sensors, analog devices, memory, sensors, large passive devices, and the like), providing an alternative to designing costly monolithic integrated devices.

These advantages provide a significant advantage. Previous design constraints of multi-die packages required a pitch of 40 μm and greater. Some embodiments such as those disclosed herein provide a pitch less than or equal to 10 μm, less than or equal to 5 μm, less than or equal to 1 μm, or the like.

Some embodiments provide advanced semiconductor products (mobile AP, FPGA, etc) a fine I/O Pitch stacking for higher device density, advanced semiconductor product multiple function blocks with different process nodes (10/16 nm FinFET, 28 nm etc) and I/O voltages sources and values (0.8V, 1.8V etc), in one stacked chip, and advanced semiconductor product SIP (system-in-package) solution with logic, analog, memory, sensor, large passive devices etc. in one stack for smaller form factor. This approach will enable flexible block partition and better cost structure of the system. For example, a previous triple voltage design on expensive 16 nm FinFET can change to a dual voltage design with smaller die size, moving the third voltage to another chip which can be supported with less expensive 40 nm technology. Lower cost is realized not only from less expensive technology, but also from pre-proven technology design IP, and shortened design cycle time.

In an embodiment, an apparatus is provided. The apparatus includes a first semiconductor chip having a first substrate, which has a plurality of first dielectric layers and a plurality of first metal lines formed in the first dielectric layers thereover. The first substrate has a thickness less than about 5 μm. A second semiconductor chip has a surface bonded to a first surface of the first semiconductor chip, wherein the second semiconductor chip includes a second substrate having a plurality of second dielectric layers and a plurality of second metal lines formed in the second dielectric layers thereover. The apparatus includes a plurality of multi-via interconnect structures, including a first multi-via interconnect structure extending from a second surface of the first semiconductor chip to a first one of the plurality of first metal lines in the second semiconductor chip and to a second one of the plurality of second metal lines in the second semiconductor chip.

In another embodiment, an apparatus is provided. The apparatus includes a first semiconductor chip having a first substrate, which has a plurality of first dielectric layers and a plurality of first metal lines formed in the first dielectric layers thereover. The first semiconductor chip is a first technology node. A second semiconductor chip has a surface bonded to a first surface of the first semiconductor chip, wherein the second semiconductor chip includes a second substrate having a plurality of second dielectric layers and a plurality of second metal lines formed in the second dielectric layers thereover. The second semiconductor chip is a second technology node, the second technology node being different than the first technology node. The apparatus includes a plurality of multi-via interconnect structures, including a first multi-via interconnect structure extending from a second surface of the first semiconductor chip to a first one of the plurality of first metal lines in the second semiconductor chip and to a second one of the plurality of second metal lines in the second semiconductor chip.

In yet another embodiment, a method is provided. The method includes providing a bonded structure having a first semiconductor chip having a first substrate bonded to a second semiconductor chip having a second substrate, the first substrate having one or more overlying first dielectric layers and a first conductive interconnect in the one or more first dielectric layers, the second substrate having one or more overlying second dielectric layers and a second conductive interconnect in the one or more second dielectric layers, the first substrate being bonded to the second substrate such that the first dielectric layers face the second dielectric layers, wherein the first semiconductor chip is a first technology node chip and the second semiconductor chip is a second technology node chip, the first technology node chip being a different technology node than the second technology node chip. A first opening is formed extending through the first substrate, and a second opening is formed extending from the first opening to a first pad formed in at least one of the first dielectric layers. A third opening is formed extending from the second opening to a second pad formed in at least one of the second dielectric layers. A first multi-via interconnect structure is formed in the first opening, second opening, and the third opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a bonded structure having a first semiconductor chip having a first substrate bonded to a second semiconductor chip having a second substrate, the first substrate having one or more first dielectric layers thereon and a first pad in the one or more first dielectric layers, the second substrate having one or more second dielectric layers thereon and a second pad in the one or more second dielectric layers, the first substrate being bonded to the second substrate such that the first dielectric layers face the second dielectric layers, wherein the first semiconductor chip is a first technology node chip and the second semiconductor chip is a second technology node chip, the first technology node chip being a different technology node than the second technology node chip;
forming a first opening extending through the first substrate;
forming a second opening extending from the first opening to the first pad;
forming a third opening extending from the first pad to the second pad; and
simultaneously forming a first multi-via interconnect structure and a redistribution layer with a conductive material, wherein the first multi-via interconnect structure is formed in the first opening, the second opening, and the third opening, wherein the redistribution layer provides an external electrical connection to the first multi-via interconnect structure.

2. The method of claim 1, further comprising forming a second multi-via interconnect structure, wherein the first multi-via interconnect structure is electrically coupled to a first voltage source and the second multi-via interconnect structure is electrically coupled to a second voltage source, the first voltage source being different than the second voltage source, wherein the first voltage source provides a first voltage value, the second voltage source provides a second voltage value, the first voltage value being different than the second voltage value.

3. The method of claim 1, further comprising forming a second multi-via interconnect structure.

4. The method of claim 3, wherein a pitch of the first and second multi-via interconnect structures is less than or equal to about 10 µm.

5. The method of claim 3, wherein a pitch of the first and second multi-via interconnect structures is less than or equal to about 5 µm.

6. The method of claim 3, wherein a pitch of the first and second multi-via interconnect structures is less than or equal to about 1 µm.

7. The method of claim 1, further comprising thinning the first substrate of the first semiconductor chip to a thickness less than about 3 µm.

8. A method comprising:
forming a first opening in a bonded structure, the bonded structure having a first semiconductor chip bonded to a second semiconductor chip, the first semiconductor chip having a first substrate, the second semiconductor chip having a second substrate, the first substrate having one or more first dielectric layers thereon and a first pad in the one or more first dielectric layers, the second substrate having one or more second dielectric layers thereon and a second pad in the one or more second dielectric layers, the first substrate being bonded to the second substrate such that the first dielectric layers face the second dielectric layers, wherein the first semiconductor chip and the second semiconductor chip are different nodes, the first opening extending through the first substrate;
forming a second opening extending from the first opening to the first pad;
forming a third opening extending from the first pad to the second pad; and
forming a first multi-via interconnect structure in the first opening, second opening, and the third opening, wherein the first multi-via interconnect structure is not electrically connected to electrical circuitry on the first semiconductor chip.

9. The method of claim 8, wherein the first semiconductor chip is a first functional type and the second semiconductor chip is a second functional type, the first functional type being different than the second functional type.

10. The method of claim 8, wherein the first substrate of the first semiconductor chip has a thickness less than about 3 µm.

11. The method of claim 8, wherein the first pad is a conductive element.

12. The method of claim 11, wherein the conductive element is not electrically connected to electrical circuitry on the first semiconductor chip.

13. The method of claim 8, further comprising:
forming a fourth opening extending through the first substrate;
forming a fifth opening extending from the fourth opening to a third pad in the one or more first dielectric layers;
forming a sixth opening extending from the third pad to a fourth pad in the one or more second dielectric layers;
forming a second multi-via interconnect structure in the fourth opening, fifth opening, and the sixth opening;
covering the first multi-via interconnect structure and the second multi-via interconnect structure with a dielectric layer; and
exposing the first multi-via interconnect structure through the dielectric layer, the second multi-via interconnect structure remaining covered by the dielectric layer after exposing the first multi-via interconnect structure.

14. The method of claim 13, wherein the first multi-via interconnect structure provides an electrical connection between electrical circuitry on the first semiconductor chip and electrical circuitry on the second semiconductor chip, the second multi-via interconnect structure not providing an external electrical connection to electrical circuitry on the first semiconductor chip and electrical circuitry on the second semiconductor chip.

15. The method of claim 13, wherein the third pad is electrically isolated from electrical circuitry on the first substrate.

16. A method comprising:
forming a first opening and a second opening in a bonded structure, the bonded structure having a first substrate and a second substrate, the first substrate having one or more first dielectric layers thereon, the one or more first dielectric layers having a first pad and a second pad therein, the second substrate having one or more second dielectric layers thereon, the one or more second dielectric layers having a third pad and a fourth pad therein, the first substrate being bonded to the second substrate such that the first dielectric layers face the second dielectric layers, electrical circuitry on the first substrate and the second substrate being different nodes, the first opening and the second opening extending through the first substrate, the first pad being electrically isolated from electrical circuitry on the first substrate;
forming a third opening extending from the first opening to the first pad;
forming a fourth opening extending from the second opening to the second pad;
forming a fifth opening extending from the first pad to the third pad;
forming a sixth opening extending from the second pad to the fourth pad;
forming a first multi-via interconnect structure in the first opening, third opening, and the fifth opening; and
forming a second multi-via interconnect structure in the second opening, fourth opening, and the sixth opening;
covering the first multi-via interconnect structure and the second multi-via interconnect structure with a dielectric layer; and
exposing the second multi-via interconnect structure, the first multi-via interconnect structure remaining covered.

17. The method of claim 16, wherein the first pad is a conductive element.

18. The method of claim 16, further comprising one or more additional multi-via interconnect structures, wherein a pitch between adjacent ones of the multi-via interconnect structures is less than or equal to about 10 µm.

19. The method of claim 16, further comprising one or more additional multi-via interconnect structures, wherein a pitch between adjacent ones of the multi-via interconnect structures is less than or equal to about 5 µm.

20. The method of claim 16, further comprising one or more additional multi-via interconnect structures, wherein a pitch between adjacent ones of the multi-via interconnect structures is less than or equal to about 1 µm.

* * * * *